US012720702B2

(12) United States Patent
Velic et al.

(10) Patent No.: US 12,720,702 B2
(45) Date of Patent: Aug. 25, 2026

(54) HIGH-VOLTAGE COMPONENT FOR A HIGH-VOLTAGE ON-BOARD ELECTRICAL SYSTEM OF AN AT LEAST PARTLY ELECTRICALLY OPERATED MOTOR VEHICLE

(71) Applicant: Dr. Ing. h.c. F. Porsche Aktiengesellschaft, Stuttgart (DE)

(72) Inventors: Timijan Velic, Weissach (DE); Maximilian Barkow, Stuttgart (DE); Patrick Fuchs, Leonberg (DE)

(73) Assignee: DR. ING. H.C. F. PORSCHE AKTIENGESELLSCHAFT, Stuttgart (DE)

( * ) Notice: Subject to any disclaimer, the term of this patent is extended or adjusted under 35 U.S.C. 154(b) by 1077 days.

(21) Appl. No.: 17/864,432

(22) Filed: Jul. 14, 2022

(65) Prior Publication Data

US 2023/0028938 A1 Jan. 26, 2023

(30) Foreign Application Priority Data

Jul. 20, 2021 (DE) ..................... 10 2021 118 756.7

(51) Int. Cl.
*H05K 9/00* (2006.01)
*B60R 16/02* (2006.01)
*H05K 7/14* (2006.01)

(52) U.S. Cl.
CPC ......... *H05K 7/14339* (2022.08); *B60R 16/02* (2013.01); *H05K 9/0047* (2013.01)

(58) Field of Classification Search
CPC .................................................... H05K 9/0047
See application file for complete search history.

(56) References Cited

U.S. PATENT DOCUMENTS 4,880,679 A * 11/1989 Bonazza ............. B29C 65/3436 428/419
9,660,434 B2 5/2017 Kett et al.
10,321,617 B2 6/2019 Gruner et al.
2014/0329125 A1 11/2014 Miyanaga et al.
2015/0107891 A1 4/2015 Haynes
2019/0296637 A1 9/2019 Li et al.

FOREIGN PATENT DOCUMENTS

CN 105556756 A 5/2016
CN 109217637 A 1/2019
DE 102010056008 A1 6/2012
DE 102013203614 A1 8/2014
DE 102016206464 A1 10/2017
EP 3057388 A1 8/2016
WO WO 2019/182132 A1 9/2019

* cited by examiner

*Primary Examiner* — Hung V Ngo
(74) *Attorney, Agent, or Firm* — LEYDIG, VOIT & MAYER, LTD.

(57) ABSTRACT

A high-voltage component for a high-voltage on-board electrical system of an at least partly electrically operated motor vehicle, including at least one housing device for at least one power electronics device of the high-voltage on-board electrical system, wherein the housing device at least partly provides at least one shielding device for reducing effects of electromagnetic interference, and wherein the shielding device includes at least one electrically non-conductive housing body of the housing device and at least one electrical discharge path arranged at least partly on and/or in the housing body and configured to connect to a vehicle reference potential.

15 Claims, 2 Drawing Sheets

10
60
20
73
25
5
4
53
43
35
40
12
63
2
33
30
23
3, 13
1
50

HIGH-VOLTAGE COMPONENT FOR A HIGH-VOLTAGE ON-BOARD ELECTRICAL SYSTEM OF AN AT LEAST PARTLY ELECTRICALLY OPERATED MOTOR VEHICLE

CROSS REFERENCE TO RELATED APPLICATIONS

This application claims benefit to German Patent Application No. DE 10 2021 118 756.7, filed on Jul. 20, 2021, which is hereby incorporated by reference herein.

FIELD

The present invention relates to a high-voltage component for a high-voltage on-board electrical system of an at least partially electrically operated motor vehicle. The high-voltage component comprises at least one housing device for at least one power electronics device of the high-voltage on-board electrical system. The invention also relates to a method for producing a high-voltage component.

BACKGROUND

In purely electric vehicles and also in hybrid vehicles, the high-voltage on-board electrical system with its correspondingly high electrical powers constitutes a notable source for electromagnetic interference effects. When developing the high-voltage on-board electrical system with its electrical components, the electromagnetic compatibility (EMC) thereof is therefore an important subject. The power electronics and in particular the inverter generally have a particularly decisive influence on the EMC.

The power electronics are therefore often provided with what is known as an EMC filter. Said EMC filter is sometimes located together with a link capacitor and power semiconductors in a common housing for accommodating the sensitive electronics components so as to protect them. In the prior art, a housing of this type is often made from aluminum. In this case, the housing is mostly used to mechanically stabilize the individual components of the inverter and to simultaneously decouple the rest of the components of the electrical drive train. In order to prevent common-mode interference due to discharge currents, the housing is generally electrically connected to the vehicle chassis. The electrical components located within the housing are usually electrically connected to the housing within the housing.

SUMMARY

In an embodiment, the present disclosure provides a high-voltage component for a high-voltage on-board electrical system of an at least partly electrically operated motor vehicle, comprising at least one housing device for at least one power electronics device of the high-voltage on-board electrical system, wherein the housing device at least partly provides at least one shielding device for reducing effects of electromagnetic interference, and wherein the shielding device comprises at least one electrically non-conductive housing body of the housing device and at least one electrical discharge path arranged at least partly on and/or in the housing body and configured to connect to a vehicle reference potential.

BRIEF DESCRIPTION OF THE DRAWINGS

Subject matter of the present disclosure will be described in even greater detail below based on the exemplary figures.

All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
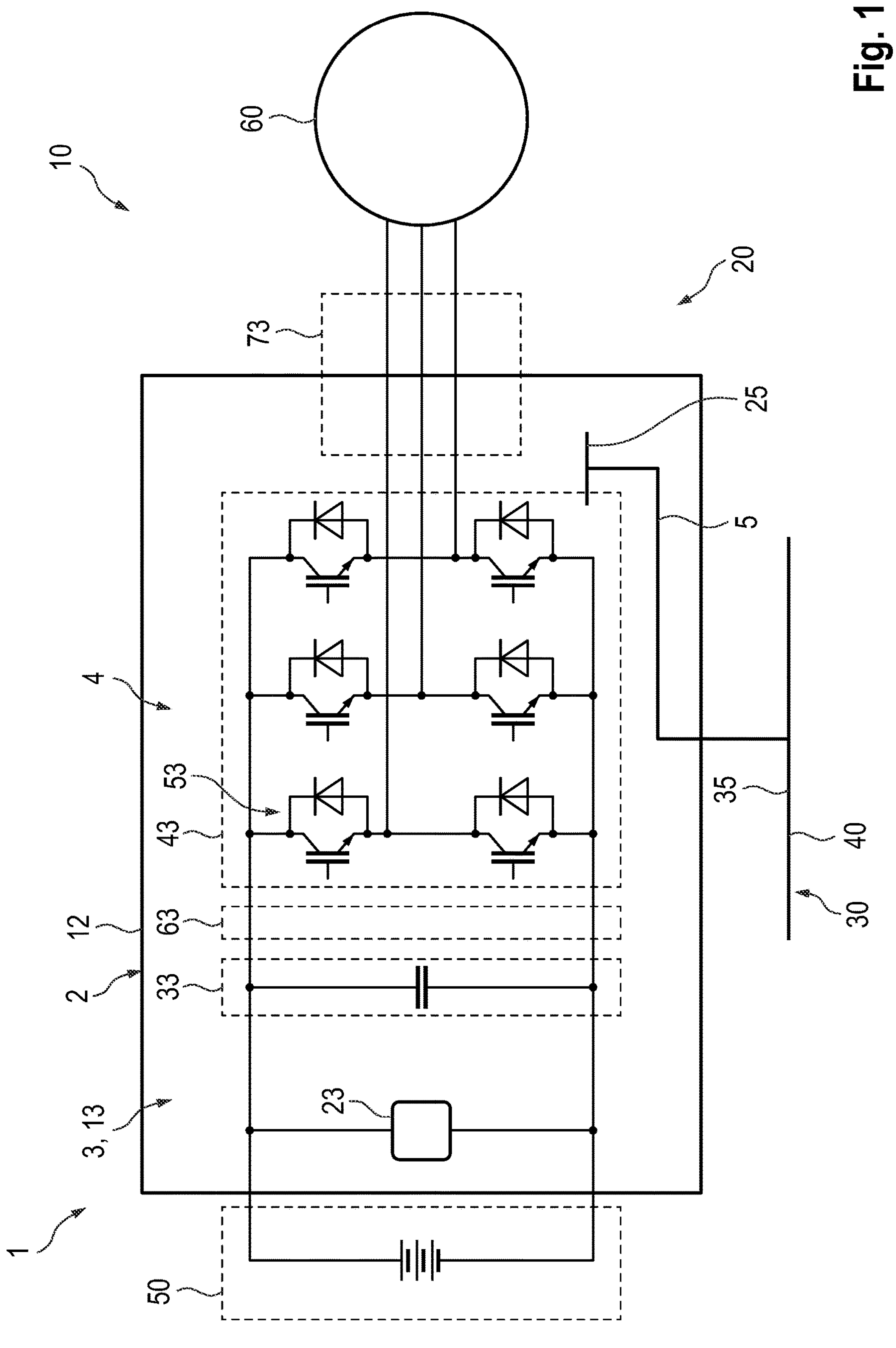
FIG. 1 shows a highly schematic illustration of a high-voltage on-board electrical system having a high-voltage component according to an embodiment of the invention.

In an embodiment, the present invention improves the EMC properties of the high-voltage on-board electrical systems in a simple manner in terms of design and at the same time in a manner that saves installation space. Further advantages and features of the present invention will emerge from the general description and from the description of the exemplary embodiment.

The high-voltage component according to an embodiment of the invention is provided and designed for a high-voltage on-board electrical system of an at least partly electrically operated motor vehicle. The high-voltage component comprises at least one housing device for at least one power electronics device (formed in particular from a plurality of electronics components and/or electronics modules interconnected with one another) of the high-voltage on-board electrical system. The housing device is preferably suitable and designed to hold at least one inverter and particularly preferably a pulse inverter (PWR). In this case, the housing device at least partly provides at least one shielding device for reducing effects of electromagnetic interference (which may originate in particular from the power electronics device). In this case, the shielding device comprises at least one electrically non-conductive housing body of the housing device. The shielding device comprises at least one electrical discharge path (in particular for discharge currents) arranged at least partly on and/or in the housing body. The discharge path is able to be electrically connected to a vehicle reference potential.

The high-voltage component according to an embodiment of the invention affords numerous advantages. A significant advantage is afforded by the provision of the shielding device by the housing device by way of its non-conductive housing body and the electrical discharge path connected thereto. This significantly improves the EMC properties of the high-voltage on-board electrical system. For example, the electromagnetic interference effects originating from the inverter are significantly reduced as a result. The non-conductive housing body also affords a particular advantage. This is because, as a result, the discharge currents only specifically run via the discharge path provided therefor. The metallic housing bodies conventional until now cannot be used for shielding at all because arbitrary paths for the discharge currents arise all over. In this case, an embodiment of the invention provides an improvement in the EMC that is simple in terms of design and can be implemented particularly economically. The function integration into the housing device so that the shielding device can be housed in a particularly installation-space-saving manner or even without an additional installation space requirement is also particularly advantageous.

The housing body is particularly preferably made from a plastic material. The housing body is manufactured in particular from at least one plastic. A non-conductive and at the same time stable housing body can be made particularly easily by using plastics. In addition, particularly high degrees of freedom with respect to geometry and design are possible for such a housing body. This enables overall an increased variety of variants, as a result of which installation space and weight can in turn be saved. Until now, the housings of inverters in the prior art have been produced by an aluminum die-casting process or permanent mold casting process, such that only very low degrees of freedom were possible for the geometric configuration on account of the die-casting profile required. Therefore, an increased variety of variants was prevented in the mass production of inverters for electric vehicles.

The housing body is particularly preferably produced by at least one additive manufacturing method. A housing body of this type is particularly well-suited to the shielding device and can be adapted in a targeted manner to the requirements with respect to shielding and protective effect of the components housed. It is also possible that the housing body is produced by at least one other primary forming process suitable for plastic materials.

In a preferred and particularly advantageous configuration, the discharge path is integrated at least in sections into the housing body. In particular, the discharge path is completely enclosed at least in sections by the material of the housing body. In particular, the discharge path is connected at least in sections to the housing body. In particular, the discharge path is connected at least in sections to the housing body fixedly and preferably not in a manner that can be released without destruction. The discharge path and the housing body can be connected to one another in a materially bonded manner. In particular, the discharge path is integrated at least in sections at at least two walls of the housing body that adjoin and in particular run transversely with respect to one another.

An integral connection of the discharge path to the housing body is preferably produced at least in sections within a primary forming process for producing the housing body. The integral connection of the discharge path to the housing body is particularly preferably produced by an additive manufacturing method of the housing body. In other words, in particular the discharge path is integrated into the housing body by virtue of the discharge path having been embedded into the housing body during the primary formation and preferably during the additive manufacture of the housing body. It is also possible that the discharge path is connected at least in sections to the housing body and preferably integrated into the housing body after the primary forming. For example, this can be done by joining and for example adhesively bonding or by inserting the discharge path into recesses of the housing body.

It is particularly preferred and advantageous that the discharge path is provided at least in sections by fibers embedded in the housing body. In particular, the discharge path comprises such fibers. In particular, the discharge path consists of such fibers. In particular, electrically conductive fibers are provided for this purpose. The fibers are connected to one another in particular in such a way that a continuous electrical conductor is formed. As a result, the discharge path can be manufactured particularly simply and at the same time in a particularly targeted manner (for example with respect to a profile geometry described below).

Within the context of the present invention, the term "fibers" is also understood to mean in particular other types of smaller conductive parts that can be embedded in the housing body so that they provide a continuous conductor. Fibers of this type can be provided for example by conductive parts or by correspondingly short line sections. The discharge path can be provided at least in sections by lines embedded in the housing body.

It is possible and advantageous that the shielding device has at least one connecting unit (arranged in particular in the housing device). In particular, the power electronics device housed in the housing device is electrically contact-connected to the discharge path by means of the connecting unit. The discharge currents can thus be transmitted from the power electronics device to the discharge path via the connecting unit. In particular, the connecting unit is electrically contact-connected to the discharge path. In particular, the connecting unit is arranged in a receiving space of the housing device for the reception of the power electronics device. In particular, the connecting unit is arranged on the housing body and preferably on an inner side of the housing body. The components of the power electronics device can be contact-connected to the at least one connecting unit individually and/or in an at least partly grouped manner.

It is also preferred and advantageous that the shielding device has at least one connecting point (arranged in particular outside of the housing device). In particular, the discharge path is electrically contact-connected to the vehicle reference potential and in particular to the vehicle chassis by means of the connecting point. In particular, the connecting point is electrically contact-connected to the discharge path. In particular, the discharge path extends between the connecting unit and the connecting point. In particular, the connecting point is arranged outside of a receiving space of the housing device for the reception of the power electronics device.

The discharge path preferably has at least one profile geometry. In one particularly advantageous configuration, the discharge path is suitable and designed to use the profile geometry to at least partly reduce electromagnetic radiation (in particular which may originate from the power electronics device during operation). The profile geometry is also used in particular to reduce electromagnetic radiation caused by the discharge currents and in particular by a flow of current in the discharge path. In particular, the profile geometry is configured in such a way that magnetic and/or electrical fields caused by discharge currents do not amplify one another and preferably compensate for or even eliminate one another at least in part. The electromagnetic radiation can additionally be further reduced by such a profile geometry.

In particular, at least the profile geometry of the discharge path is integrated into the housing body. In particular, the discharge path has a profile geometry of this type at least in sections between the connecting unit and the connecting point. The profile geometry extends in particular via at least two walls of the housing body that adjoin and preferably run transversely with respect to one another. The discharge path runs in particular at at least one top surface and at at least one side surface of the housing body running transversely with respect to the top surface. In particular, the profile geometry comprises at least one change in direction and preferably a plurality of specific changes in direction of the discharge path along the housing body. For example, the profile geometry has discharge sections that run transversely with respect to one another (in particular in a common plane).

The profile geometry is preferably designed so that those magnetic fields resulting during operation of the power electronics device when a current flows through the discharge path can compensate for one another in a targeted manner. As a result, those electrical fields resulting due to changes in the magnetic fields over time can preferably also be reduced. A magnetic field is understood here as meaning in particular a magnetic flux density (also referred to as a so-called B field in technical language). An electrical field is understood here as meaning in particular an electrical field strength (also referred to as a so-called E field in technical language).

The high-voltage component can comprise at least one power electronics device and preferably at least one inverter and particularly preferably at least one pulse inverter (PWR). In particular, the high-voltage component comprises such a power electronics device which is held in the housing body and at least partly shielded by the shielding device. In particular, the power electronics device is electrically connected to the discharge path via the connecting unit. In particular, the power electronics device is electrically contact-connected to the vehicle reference potential via the connecting point. In this case, the power electronics device can comprise at least one component taken from a group of components comprising: inverter and preferably pulse inverter, EMC filter, link capacitor, power module, power semiconductor, DC bus, AC bus.

In particular, the power electronics device is suitable and designed to actuate at least one electric machine and preferably an electric traction drive and for example a permanently excited synchronous machine. In particular, the power electronics device is suitable and designed to generate an alternating current or an AC voltage with a defined frequency from a direct current or a DC voltage of a high-voltage battery. In particular, the power electronics device can adjust the frequency depending on the traction drive and for example a desired power.

The method according to an embodiment of the invention is used to produce a high-voltage component for a high-voltage on-board electrical system of an at least partly electrically operated motor vehicle. The high-voltage component comprises at least one housing device for at least one power electronics device of the high-voltage on-board electrical system. The housing device at least partly provides at least one shielding device for reducing effects of electromagnetic interference. In order to provide the shielding device, at least one electrically non-conductive housing body is formed by primary forming and preferably by an additive manufacturing process. At least one electrical discharge path is formed on and/or in the housing body. In particular, the discharge path is electrically contact-connected to the power electronics device and to a vehicle reference potential.

The method according to an embodiment of the invention also particularly advantageously achieves the above-stated benefits. In particular, the method is designed so that the high-voltage component according to an embodiment of the invention or one of the configurations thereof can be produced. In particular, the high-voltage component according to an embodiment of the invention can be produced according to the method.

In particular, the discharge path is integrated into the housing body. In particular, conductive parts and in particular fibers are joined and preferably embedded into a non-conductive material and preferably plastic material of the housing body. The discharge path is particularly preferably produced by embedding conductive fibers and preferably formed at the same time as primary forming of the housing body. In particular, the conductive fibers are embedded during additive manufacture of the housing body.

Within the context of the present invention, the vehicle reference potential is to be understood in particular as a potential of zero or another potential provided in operation. The vehicle reference potential corresponds in particular to the potential of the vehicle ground and for example of the vehicle chassis. A connection to the vehicle reference potential corresponds in particular to a connection to the vehicle ground and for example to the vehicle chassis. Within the context of the present invention, the conductivity is referred in particular to the voltages or currents to be expected during operation as intended.

The shielding device is used in particular to shield against interference effects relevant to the EMC. In particular, the shielding device is suitable and designed to counteract common-mode interference and/or differential-mode interference (by means of the discharge path). The shielding device may be part of a shielding system which comprises further components for reducing effects of electromagnetic interference. The shielding system may comprise for example at least one EMC filter. The further components of the shielding system are operatively connected in particular to the shielding device. However, the shielding device can also be formed separately.

The discharge path enables in particular discharge currents to the vehicle reference potential and in particular in the direction of the vehicle chassis. The discharge path comprises in particular at least one and preferably at least two or a plurality of discharge sections. The discharge sections are in particular electrically connected to one another. For example, the individual discharge sections form a discharge path of branched design. In particular, the discharge path is suitable and designed to enable discharge currents to the vehicle reference potential. In particular, the discharge path is suitable and designed to counteract common-mode interference and/or differential-mode interference.

The housing body provides in particular mechanical protection for the power electronics device and preferably for the inverter. In particular, the housing body provides a receiving space at least for the inverter. In particular, the housing body is used to house (all of) the components belonging to the inverter. The housing body is in particular an inverter housing. In particular, the housing body is used not only to house an individual component of the inverter and for example a diode. The housing device can comprise further housing parts, for example assembly means for securing the housing body or the like. It is possible that at least one further housing part supports the mechanical effect of the housing body.

Further advantages and features of the present invention will emerge from the exemplary embodiments, which will be discussed below with reference to the appended figures.

FIG. 1 shows a high-voltage component 1 according to an embodiment of the invention for a high-voltage on-board electrical system 10 of an electrically operated motor vehicle 20. The high-voltage component 1 comprises a housing device 2 having an electrically non-conductive housing body 12 and has been produced according to an embodiment of the method according to the invention. The housing body 12 is used to house a power electronics device 3, in this case formed as an inverter 13 and for example pulse inverter.

The high-voltage on-board electrical system 10 in this case comprises a high-voltage battery 50 and an electric machine 60, designed as a permanently excited synchronous machine, for a traction drive. The power electronics device 3 in this case provides the alternating current required for the machine 60 from the direct current of the high-voltage battery 50. The machine 60 can be actuated via the frequency of said alternating current. To this end, the power electronics device 3 is provided here purely as an example with an EMC filter 23, a link capacitor 33, a power module 43 having a plurality of power semiconductors 53 and a DC bus 63 and an AC bus 73. The components held within the housing body 12 are in this case also shown within the housing body 12.

In order to reduce the effects of electromagnetic interference originating from the inverter 13 during operation, a shielding device 4 is provided here. In this case, the housing body 12 forms an essential part of the shielding device 4 here. In addition, the shielding device 4 comprises an electrical discharge path 5 connected to a vehicle reference potential 30 via one or more connecting points 35. In this case, the vehicle chassis 40 is provided for example as vehicle reference potential 30.

Within the housing body 12, the discharge path 5 is electrically contact-connected to the power electronics device 3 and for example to the power module 43 via one or more connecting units 25. Discharge currents can flow to the vehicle chassis 40 via the discharge path 5 in order for example to eliminate common-mode interference and/or differential-mode interference.

Figure 2:
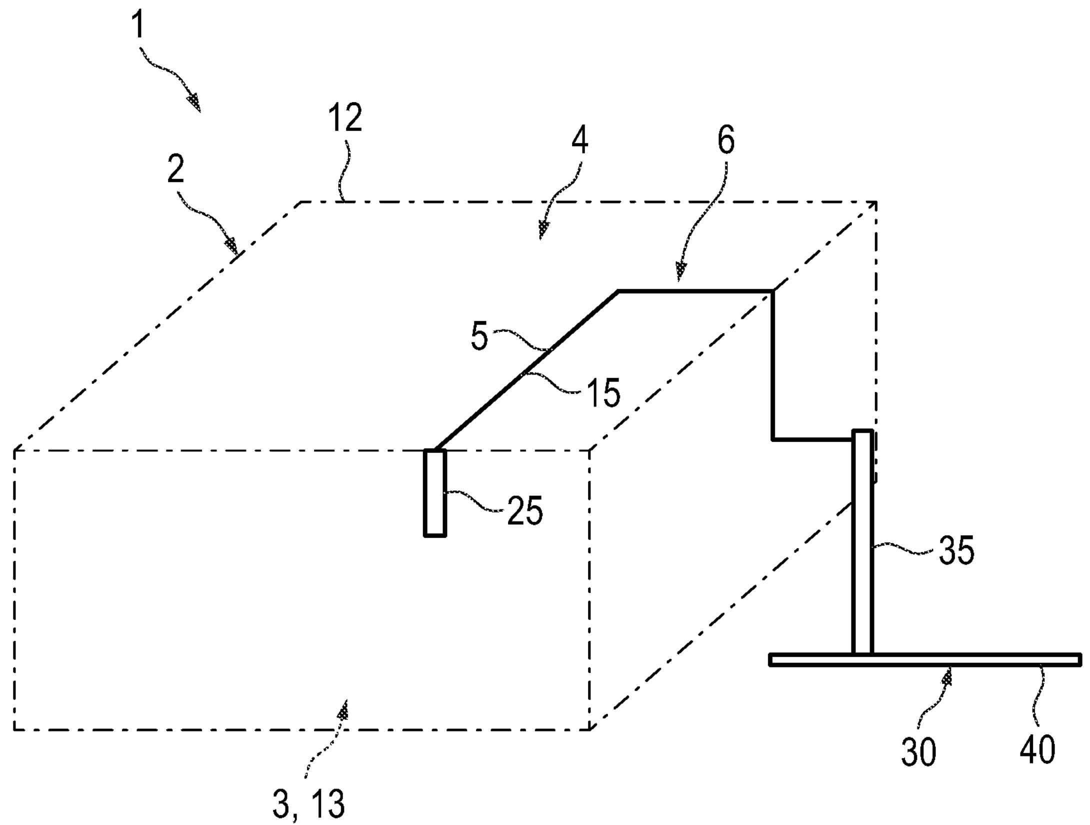
FIG. 2 shows a detailed illustration of the high-voltage component of FIG. 1.

In FIG. 2, the shielding device 4 having the housing body 12 and the discharge path 5 is illustrated in more detail. The inverter 13 is located in this case inside the housing body 12. For the purpose of better illustration, the housing body 12 is shown here as partly transparent so that the connecting unit 25 and the embedded discharge path 5 located inside are visible. The discharge path 5 is contact-connected to the vehicle chassis 40 via the connecting point 35 outside of the housing body 12.

The discharge path is in this case fixedly integrated into the housing body 12. To this end, electrically conductive fibers 15 are embedded in the housing body 12 during the primary forming thereof. In the example shown here, the housing body 12 is made of a plastic material by an additive manufacturing method. During the additive manufacturing, the fibers 15 are specifically embedded in particular regions of the housing body 12. The targeted distribution of the fibers 15 results in a particular profile geometry 6 for the discharge path 5 inside the housing body 12. The geometric shape of the housing body 12 and the profile geometry 6 of the discharge path 5 are shown here purely by way of example.

The profile geometry 6 is designed here so that those magnetic fields arising when a current flows through the discharge path 5 can at least partly compensate for one another. At the same time, the electrical fields that would otherwise result due to changes in the magnetic fields over time are also reduced. Electromagnetic radiation can be significantly reduced by such intelligent shaping of a profile geometry 6 of the electrical discharge path 5.

A particular advantage of the invention is that defined routes for the discharge currents are formed by the non-conductive housing body 12 in combination with the electrically conductive discharge path 5. As a result, a compensation of B fields and thus also a reduction in E fields is possible. At the same time, arbitrary and non-controllable discharge currents outside of the electrical discharge path 5 are effectively prevented as a result. Undesired capacitive low-impedance paths for discharge currents are also prevented in the invention. It is thus possible to significantly reduce electromagnetic radiation and to significantly improve electromagnetic compatibility overall.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE DESIGNATIONS

1 High-voltage component
2 Housing device
3 Power electronics device
4 Shielding device
5 Discharge path
6 Profile geometry
10 High-voltage on-board electrical system
12 Housing body
13 Inverter
15 Fiber
20 Motor vehicle
23 EMC filter
25 Connecting unit
30 Vehicle reference potential
33 Link capacitor
35 Connecting point
40 Vehicle chassis
43 Power module
50 High-voltage battery
53 Power semiconductor
60 Machine
63 DC bus
73 AC bus

The invention claimed is:

1. A high-voltage component for a high-voltage on-board electrical system of an at least partly electrically operated motor vehicle, comprising:

at least one housing device for at least one power electronics device of the high-voltage on-board electrical system, wherein:

the housing device at least partly provides at least one shielding device for reducing effects of electromagnetic interference, the at least one shielding device comprises at least one electrically non-conductive housing body of the housing device and at least one electrical discharge path arranged at least partly on and/or in the housing body and configured to connect to a vehicle reference potential, and the at least one shielding device has at least one connecting unit by which the power electronics device housed in the housing device is electrically contact-connected to the discharge path.

2. The high-voltage component as claimed in the claim 1, wherein the housing body is made from a plastic material.

3. The high-voltage component as claimed in claim 1, wherein the housing body is additively manufactured.

4. The high-voltage component as claimed in claim 1, wherein the discharge path is integrated at least in sections into the housing body.

5. The high-voltage component as claimed in claim 1, wherein an integral connection of the discharge path to the housing body is produced as part of a primary forming process for producing the housing body.

6. The high-voltage component as claimed in claim 1, wherein the discharge path is provided at least in sections by fibers embedded in the housing body.

7. The high-voltage component as claimed in claim 1, wherein the at least one shielding device has at least one connecting point by which the discharge path is electrically contact-connected to the vehicle reference potential.

8. The high-voltage component as claimed in claim 7, wherein the vehicle reference potential is a vehicle chassis.

9. The high-voltage component as claimed in claim 1, wherein the discharge path has a profile geometry and is configured to use the profile geometry to at least partly reduce electromagnetic radiation which originates from the power electronics device during operation.

10. The high-voltage component as claimed in claim 9, wherein the profile geometry is configured such that magnetic fields resulting during operation of the power electronics device when a current flows through the discharge path compensate for one another in a targeted manner and wherein, as a result, electrical fields resulting due to changes in the magnetic fields over time are reduced.

11. The high-voltage component as claimed in claim 1, wherein the at least one power electronics device is held in the housing body and at least partly shielded by the at least one shielding device.

12. The high-voltage component as claimed in claim 11, wherein the at least one power electronics device is a pulse inverter.

13. The high-voltage component as claimed in claim 1, wherein the at least one power electronics device is an inverter.

14. A method for producing a high-voltage component for a high-voltage on-board electrical system of an at least partly electrically operated motor vehicle, wherein the high-voltage component comprises at least one housing device for at least one power electronics device of the high-voltage on-board electrical system, wherein the housing device at least partly provides at least one shielding device for reducing effects of electromagnetic interference, the method comprising:

forming, in order to provide the at least one shielding device, at least one electrically non-conductive housing body of the at least one shielding device;

forming at least one electrical discharge path of the at least one shielding device at least partly on and/or in the housing body, the at least one electrical discharge path being configured to connect to a vehicle reference potential; and electrically contact-connecting the discharge path to the power electronics device and to a vehicle reference potential with at least one connecting unit of the at least one shielding device.

15. The method of claim 14, wherein the at least one electrically non-conductive housing body is additively manufactured.

* * * * *